United States Patent
Rahman (10) Patent No.: US 8,779,553 B2
(45) Date of Patent: Jul. 15, 2014

(54) STRESS-AWARE DESIGN FOR INTEGRATED CIRCUITS COMPRISING A STRESS INDUCING STRUCTURE AND KEEP OUT ZONE

(75) Inventor: Arifur Rahman, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 326 days.

(21) Appl. No.: 13/162,541

(22) Filed: Jun. 16, 2011

(65) Prior Publication Data

US 2012/0319248 A1 Dec. 20, 2012

(51) Int. Cl.
*H01L 29/06* (2006.01)

(52) U.S. Cl.
USPC ........... 257/618; 257/621; 257/698; 257/773; 257/774; 257/E23.011; 716/106; 716/110; 716/119; 716/132

(58) Field of Classification Search
None
See application file for complete search history.

(56) References Cited

U.S. PATENT DOCUMENTS

| | | |
|---|---|---|
| 8,082,537 B1 | 12/2011 | Rahman |
| 2008/0128883 A1 | 6/2008 | Lee |
| 2009/0079071 A1 | 3/2009 | Webb |
| 2009/0134500 A1 | 5/2009 | Kuo |
| 2010/0257495 A1 | 10/2010 | Wu |
| 2010/0270597 A1* | 10/2010 | Sproch et al. ................ 257/255 |
| 2011/0073917 A1 | 3/2011 | Zhong et al. |
| 2011/0095367 A1 | 4/2011 | Su et al. |

OTHER PUBLICATIONS

Vandevelde, Bart et al., "Thermo-mechanics of 3D-wafer level and 3D stacked IC packaging technologies", IMEC, Thermal, Mechanical and Multi-physics simulation and experiments in Microelectronics and Micro-systems, 2008, EUROSIME 2008, International Conference on, IEEE, Apr. 20, 2008, pp. 1-7, Piscataway, NJ, USA.
U.S. Appl. No. 13/170,020, filed Jun. 27, 2011, Rahman, Xilinx, Inc. 2100 Logic Drive, San Jose, CA 95124.

* cited by examiner

Primary Examiner — Marcos D. Pizarro
Assistant Examiner — Cesar Lopez
(74) Attorney, Agent, or Firm — Kevin T. Cuenot (57) ABSTRACT

A method of circuit design involving an integrated circuit (IC) having an interposer can include identifying an active resource implemented within the IC within a region of the interposer exposed to an amount of stress that exceeds a normalized amount of stress on the interposer and selectively assigning an element of the circuit design to be implemented within the IC to the active resource according to a stress-aware analysis of the circuit design as implemented within the IC.

18 Claims, 6 Drawing Sheets

STRESS-AWARE DESIGN FOR INTEGRATED CIRCUITS COMPRISING A STRESS INDUCING STRUCTURE AND KEEP OUT ZONE

FIELD OF THE INVENTION

One or more embodiments disclosed within this specification relate to integrated circuits (ICs). More particularly, one or more embodiments relate to stress-aware design for ICs and stress-aware implementation of circuit designs within ICs.

BACKGROUND

Circuit designs continue to become larger, requiring larger integrated circuits (ICs) for implementation. In some cases, a circuit design that can be implemented using a single, larger die can be implemented using an IC that includes two or more smaller dies. An IC that includes two or more smaller dies can be referred to as a "multi-die IC." A multi-die IC is generally characterized as including two or more dies coupled to one another and placed within a single IC package. The circuit design is implemented across the multiple dies in lieu of using a single, larger die.

Multi-die ICs typically include physical traits that are not present within their single-die IC counterparts. For example, multi-die ICs can include Through Silicon Vias (TSVs). A TSV can be characterized as a vertical conductive path that extends completely through a die of the multi-die IC. Each TSV can electrically couple a node on a top surface of the die through which the TSV extends with a different node on a bottom surface of the same die.

Another example of a physical trait found within multi-die ICs is the physical coupling of dies. The individual dies of a multi-die IC are typically physically coupled together in some manner. For instance, the dies can be stacked or bonded.

These and other physical traits can induce stress within one or more of the dies of a multi-die IC. The stress, which is typically greater than the normalized stress that exists within a die of a conventional, single die IC, can detrimentally affect the performance of active devices implemented within the multi-die IC.

SUMMARY

One or more embodiments disclosed within this specification relate to integrated circuits (ICs) and, more particularly, to stress-aware design for ICs and stress-aware implementation of circuit designs within ICs.

An embodiment can include a method of circuit design involving an integrated circuit (IC) having an interposer. The method can include identifying an active resource implemented within the IC within a region of the interposer exposed to an amount of stress that exceeds a normalized amount of stress on the interposer and selectively assigning an element of the circuit design to be implemented within the IC to the active resource according to a stress-aware analysis of the circuit design as implemented within the IC.

Another embodiment can include an IC. The IC can include a first die. The first die can include a stress inducing structure. The first die further can include a first zone characterized by a substantially normalized stress throughout the first zone and a second zone induced by the stress inducing structure and characterized by a higher than normalized stress throughout the second zone. An active device can be located within the second zone.

Another embodiment can include a device having a non-transitory data storage medium usable by a system including a processor and a memory. The data storage medium can store program code that, when executed by the system, causes the system to execute operations. The operations can include identifying an active resource implemented within the IC within a region of the interposer exposed to an amount of stress that exceeds a normalized amount of stress on the interposer and selectively assigning an element of the circuit design to be implemented within the IC to the active resource according to a stress-aware analysis of the circuit design as implemented within the IC.

DETAILED DESCRIPTION OF THE DRAWINGS

While the specification concludes with claims defining features of one or more embodiments that are regarded as novel, it is believed that the one or more embodiments will be better understood from a consideration of the description in conjunction with the drawings. As required, one or more detailed embodiments are disclosed within this specification. It should be appreciated, however, that the one or more embodiments are merely exemplary. Therefore, specific structural and functional details disclosed within this specification are not to be interpreted as limiting, but merely as a basis for the claims and as a representative basis for teaching one skilled in the art to variously employ the one or more embodiments in virtually any appropriately detailed structure. Further, the terms and phrases used herein are not intended to be limiting, but rather to provide an understandable description of the one or more embodiments disclosed herein.

One or more embodiments disclosed within this specification relate to integrated circuits (ICs) and, more particularly, to stress-aware design for ICs and stress-aware implementation of circuit designs within ICs. The use or inclusion of various structures, particularly structures used in forming multi-die IC structures, can result in an increased amount of stress being applied to the die or dies of a multi-die IC structure. Active resources implemented within a region of the multi-die IC structure that are exposed to increased stress can exhibit variation in one or more operating characteristics compared to active resources not located within regions of increased stress. Typically, the variation in operating characteristics manifests itself in the form of degraded operating characteristics of the active resource.

One or more embodiments disclosed within this specification account for increased stress within a die or dies of a multi-die IC structure. For example, the location of active resources implemented within a multi-die IC structure during physical design of the multi-die IC structure can be selected based upon a determination of stress existing within the multi-die IC structure. In general, during design and fabrication of the multi-die IC structure, active resources can be located closer to stress inducing structures than otherwise would be the case by observing any stress induced degradation in the active resources. In this regard, one or more circuit design implementation tasks such as placement, routing, or the like, can be performed in a stress-aware manner that accounts for degraded operating characteristics of the active resources caused by exposure to increased stress within the multi-die IC structure.

Figure 1:
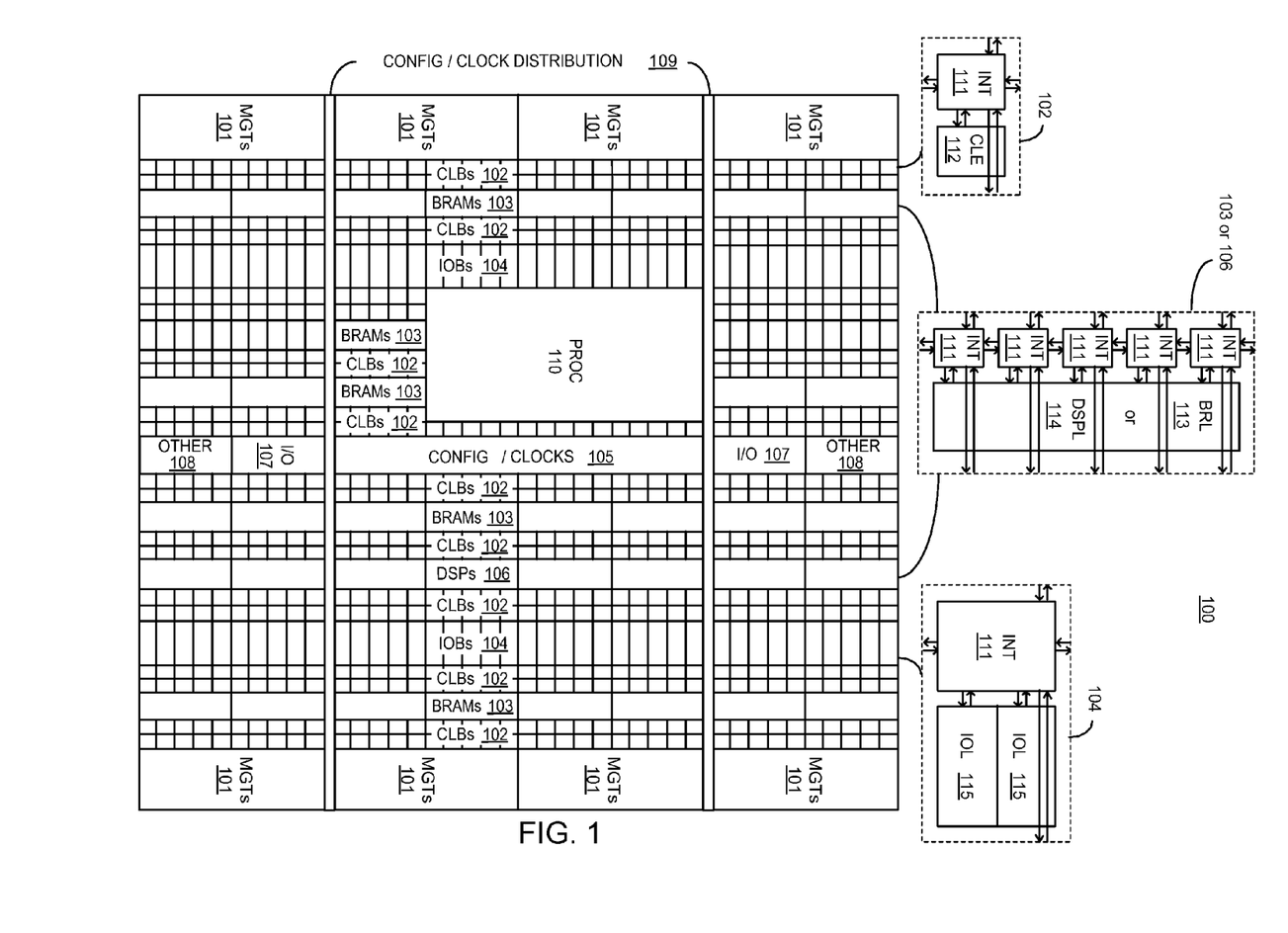
FIG. 1 is a first block diagram illustrating an architecture for an integrated circuit (IC) in accordance with an embodiment disclosed within this specification.

FIG. 1 is a first block diagram illustrating an architecture 100 for an IC in accordance with an embodiment disclosed within this specification. Architecture 100 can be implemented within a field programmable gate array (FPGA) type of IC, for example. As shown, architecture 100 includes several different types of programmable circuit, e.g., logic, blocks. For example, architecture 100 can include a large number of different programmable tiles including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing blocks (DSPs) 106, specialized I/O blocks 107 (e.g., configuration ports and clock ports), and other programmable logic 108 such as digital clock managers, analog-to-digital converters, system monitoring logic, and so forth.

In some ICs, each programmable tile includes a programmable interconnect element (INT) 111 having standardized connections to and from a corresponding INT 111 in each adjacent tile. In some cases, INTs 111 can be referred to as programmable interconnection points (PIPs). In any case, INTs 111, taken together, implement the programmable interconnect structure for the illustrated IC. Each INT 111 also includes the connections to and from the programmable logic element within the same tile, as shown by the examples included at the top of FIG. 1.

For example, a CLB 102 can include a configurable logic element (CLE) 112 that can be programmed to implement user logic plus a single INT 111. A BRAM 103 can include a BRAM logic element (BRL) 113 in addition to one or more INTs 111. Typically, the number of INTs 111 included in a tile depends on the height of the tile. In the pictured embodiment, a BRAM tile has the same height as five CLBs, but other numbers (e.g., four) can also be used. A DSP tile 106 can include a DSP logic element (DSPL) 114 in addition to an appropriate number of INTs 111. An IOB 104 can include, for example, two instances of an I/O logic element (IOL) 115 in addition to one instance of an INT 111. As will be clear to those of skill in the art, the actual I/O pads connected, for example, to IOL 115 typically are not confined to the area of IOL 115.

In the example pictured in FIG. 1, a columnar area near the center of the die is used for configuration, clock, and other control logic. Horizontal areas 109 extending from this column are used to distribute the clocks and configuration signals across the breadth of the programmable IC. Some ICs utilizing the architecture illustrated in FIG. 1 include additional logic blocks that disrupt the regular columnar structure making up a large part of the IC. The additional logic blocks can be programmable blocks and/or dedicated circuitry. For example, a processor block depicted as PROC 110 spans several columns of CLBs and BRAMs.

PROC 110 can be implemented as a hard-wired processor that is fabricated as part of the die that implements the programmable circuitry of the IC. PROC 110 can represent any of a variety of different processor types and/or systems ranging in complexity from an individual processor, e.g., a single core capable of executing program code, to an entire processor system having one or more cores, modules, co-processors, interfaces, or the like.

In a more complex arrangement, for example, PROC 110 can include one or more cores, e.g., central processing units, cache memories, a memory controller, unidirectional and/or bidirectional interfaces configurable to couple directly to I/O pins, e.g., I/O pads, of the IC and/or couple to the programmable circuitry of the IC.

The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 1 that are external to PROC 110 can be considered part of the, or the, programmable circuitry of the IC.

FIG. 1 is intended to illustrate an exemplary architecture that can be used to implement an IC that includes programmable circuitry, e.g., a programmable fabric, and a processor system. For example, the number of logic blocks in a column, the relative width of the columns, the number and order of columns, the types of logic blocks included in the columns, the relative sizes of the logic blocks, and the interconnect/logic implementations included at the top of FIG. 1 are purely exemplary.

In an actual IC, for example, more than one adjacent column of CLBs is typically included wherever the CLBs appear, to facilitate the efficient implementation of a user circuit design. The number of adjacent CLB columns, however, can vary with the overall size of the IC. Further, the size and/or positioning of PROC 110 within the IC is for purposes of illustration only and is not intended as a limitation of the one or more embodiments disclosed within this specification.

Referring again to FIG. 1, the programmable circuitry is typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

An FPGA is one type of a programmable IC. Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs can also be implemented in other ways, e.g., using fuse or antifuse technology.

The phrase "programmable IC" can include, but is not limited to these devices and further can encompass devices that are only partially programmable. For example, one type of programmable IC includes a combination of hard-coded transistor logic and a programmable switch fabric that programmably interconnects the hard-coded transistor logic. For example, an application specific IC (ASIC) that includes at least some programmable circuitry can be considered a programmable IC.

Figure 2:
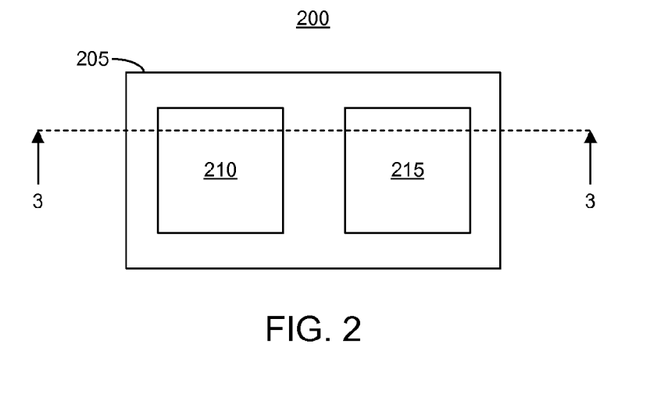
FIG. 2 is a second block diagram illustrating a topographic view of a multi-die IC structure in accordance with another embodiment disclosed within this specification.

FIG. 2 is a second block diagram illustrating a topographic view of a multi-die IC structure in accordance with another embodiment disclosed within this specification. In one aspect, multi-die IC structure 200 (IC structure 200) illustrates one approach to stacking multiple dies within a single IC package. IC structure 200 can include a silicon interposer (interposer) 205, a die 210, and a die 215.

Interposer 205 can be a die having a planar surface on which dies 205 and 210 can be horizontally stacked. As shown, dies 205 and 210 can be located on the planar surface of interposer 205 side-by-side. Although implemented with two horizontally stacked dies within FIG. 2, IC structure 200 also can be implemented with more than two dies being horizontally stacked. In another embodiment, die 215 can be stacked vertically on top of die 210. In still another embodiment, interposer 205 can be used as an intermediate layer between two vertically stacked dies. In that case, interposer 205 can isolate vertically stacked dies from one another within a multi-die IC package.

Interposer 205 can provide a common mounting surface and electrical coupling point for two or more dies of a multi-die IC. Interposer 205 can serve as an intermediate layer for interconnect routing between dies or as a ground or power plane for the multi-die IC. Interposer 205 can be implemented with a silicon wafer substrate, whether doped or un-doped with an N-type and/or a P-type impurity. The manufacturing of interposer 205 can include one or more additional process steps that allow the deposition of one or more layer(s) of metal interconnect. These metal interconnect layers can include aluminum, gold, copper, nickel, various silicides, and/or the like.

Interposer 205 can be manufactured using one or more additional process steps that allow the deposition of one or more dielectric or insulating layer(s) such as, for example, silicon dioxide. In addition, interposer 205 can be manufactured using one or more additional process steps that allow the creation of active resources such as, for example, transistor devices. As noted, interposer 205 is, in general, a die and is characterized by the presence of one or more Through Silicon Vias (TSVs) as will be described in greater detail within this specification.

The phrase "active resource" can refer to an individual active device or active circuit element such as an individual transistor or diode. The phrase "active resource" also can refer to more complex circuitry that includes one or more active devices, e.g., circuit blocks, tiles, logic blocks, interconnect circuitry, INTs, programmable interconnect points, function blocks, or the like. The aforementioned different types of circuitry generally include at least one active device to effectuate the programmability described. It should be appreciated that while an active resource is generally characterized by the inclusion of at least one active device, one or more passive devices also can be included.

IC structure 200 is presented for purposes of illustration and is not intended as a limitation of the one or more embodiments disclosed within this specification. In this regard, each of dies 210 and 215 and interposer 205 can be implemented in any of a variety of different forms. For example, in addition to the functionality already described, one or more of interposer 205 and dies 210 and/or 215 can be implemented as a memory, a processor, a programmable IC, or the like. IC structure 200 can be implemented to include various combinations of such circuitry.

In illustration, die 210 can be a processor while die 215 is implemented as a memory. In another illustration, both dies 210 and 215 can be implemented as programmable ICs (dies). In still another illustration, any of the various combinations can be implemented with interposer 205 being configured as, or to include, programmable circuitry, a memory, a processor, other active resources, or the like.

Figure 3:
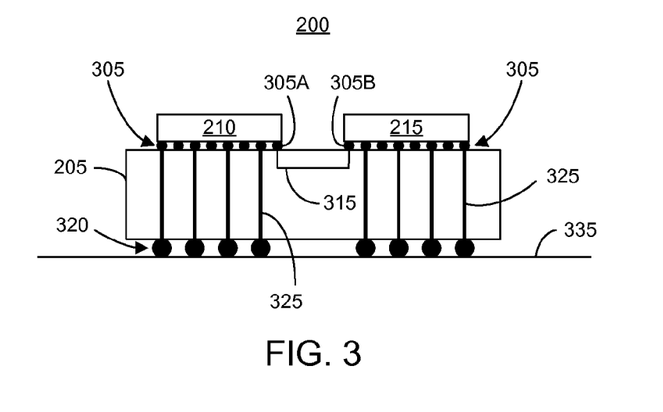
FIG. 3 is a third block diagram illustrating a cross-sectional side view of a multi-die IC structure in accordance with another embodiment disclosed within this specification.

FIG. 3 is a third block diagram illustrating a cross-sectional side view of a multi-die IC structure in accordance with another embodiment disclosed within this specification. More particularly, FIG. 3 illustrates a view of IC structure 200 of FIG. 2 taken along cut-line 2-2. As such, like numbers will be used to refer to the same items throughout this specification to the extent possible.

Referring to FIG. 3, each of dies 210 and 215 can be electrically coupled to interposer 205 via solder bumps 305. In addition, each of solder bumps 305 can serve to physically attach dies 210 and 215 to interposer 205. Through solder bumps 305, for example, interposer 205 is coupled to die 210. Similarly, through solder bumps 305, die 215 is coupled to interposer 205.

Although the coupling of dies 210 and 215 to interposer 205 is accomplished through solder bumps 305, a variety of other techniques can be used to couple interposer 205 to dies 210 and 215. For example, bond wires or edge wires can be used to couple dies of a multi-die IC to an underlying interposer. In another example, an adhesive material can be used to physically attach dies 210 and 215 to interposer 205. As such, the coupling of dies 210 and 215 to interposer 205 via solder bumps 305, as illustrated within FIG. 3, is provided for purposes of illustration and is not intended to limit the one or more embodiments disclosed within this specification.

Interconnect material within interposer 205 can be used to pass inter-die signals between dies 210 and 215. For example, interconnect 315 can be coupled to each of solder bumps 305A and 305B to couple die 210 to die 215, thereby allowing the exchange of inter-die signals between dies 210 and 215. In addition, interposer 205 can be implemented with multiple conductive layers that can be coupled together with vias (not shown). In that case, interconnect 315 can be implemented within two or more conductive layers coupled together using vias within interposer 205. The use of multiple conductive layers to implement interconnects within interposer 205 allows a greater number of signals to be routed and more complex routing of signals to be achieved within interposer 205.

Within this specification, the same reference characters are used to refer to terminals, signal lines, wires, and their corresponding signals. In this regard, the terms "signal," "wire," "connection," "terminal," and "pin" may be used interchangeably, from time-to-time, within this specification. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

Solder bumps 320 can be used to electrically couple IC structure 200 to a surface 335. Surface 335 can represent, for example, a multi-die IC package in which IC structure 200 is implemented. Solder bumps 320 further can couple IC structure 200 directly to a node external to the multi-die IC package. For example, solder bumps 320 can be used to physically attach interposer 205 to surface 335. TSVs 325 represent vias that, when filled with conductive material, form an electrical connection that vertically transverses, e.g., extends through, most, all, or substantially all, of interposer 205.

TSVs 325 can be implemented by drilling or etching an opening into interposer 205 that extends from a first planar surface, i.e., the surface to which solder bumps 305 are coupled, through to a second planar surface, i.e., the surface to which solder bumps 320 are coupled. Conductive material then can be deposited within TSVs 325. Examples of conductive material that can be used to fill TSVs 325 can include, but are not limited to, copper, aluminum, gold, copper, nickel, various silicides, and/or the like.

TSVs 325, in combination with solder bumps 320, couple die 210 to surface 335. As noted, one or more additional process steps can be used to implement active circuit elements within interposer 205. Generally with multi-die ICs, large sections of the silicon interposer, including portions surrounding interconnect and TSVs, remain unused. In accordance with one or more embodiments disclosed within this specification, active resources such as transistors and diodes can be implemented within portions of interposer 205 that would otherwise be unused.

As shown within FIG. 3, the first planar surface of interposer 205 can be physically coupled to dies 210 and 215. The second planar surface of interposer 205 can be physically coupled to surface 335. Each of dies 210 and 215 and surface 335 can be implemented using materials that can have differing coefficients of thermal expansion as compared to interposer 205. As a result, each of interposer 205, dies 210 and 215, and surface 335 can expand at different rates when exposed to changes in temperature.

When implemented within a system, an IC package that includes interposer 205, dies 210 and 215, and surface 335, can be affected by changes in temperature external to the IC package. In addition, in a powered on state, circuit elements within IC structure 200 can generate heat that can alter the temperature of interposer 205, dies 210 and 215, and surface 335. The changes in temperature can result in continual expansion and contraction of each of interposer 205, dies 210 and 215, and surface 335.

As each of dies 210 and 215 and surface 335 can have a different coefficient of thermal expansion than interposer 205, each can expand and contract at a different rate than interposer 205. With each of dies 210 and 215 and surface 335 being physically coupled to interposer 205, the different rates of expansion and contraction between interposer 205, dies 210 and 215, and surface 335 result in the application of forces to the respective components. These forces can create stress within interposer 205 that can increase in areas surrounding openings through interposer 205, such as TSVs 325.

In addition, the conductive material used to fill TSVs 325 can have a different coefficient of thermal expansion than interposer 205. In that case, the conductive material used to fill each TSV 325 can expand and contract at a different rate than interposer 205. As a result, the conductive material can exert an additional force on interposer 205 from within the TSVs 325, thereby further increasing the stress applied to areas of interposer 205 surrounding TSVs 325.

Figure 4:
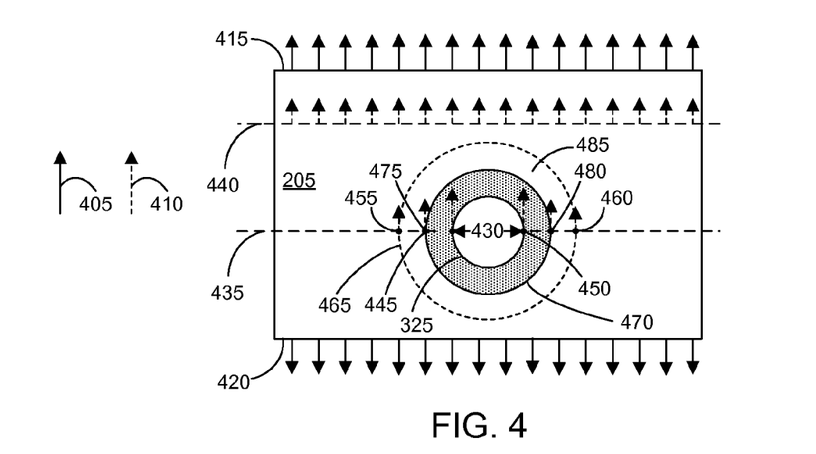
FIG. 4 is a fourth block diagram illustrating exemplary effects of stress within a multi-die IC interposer surrounding a Through Silicon Via (TSV) in accordance with another embodiment disclosed within this specification.

FIG. 4 is a fourth block diagram illustrating exemplary effects of stress within a multi-die IC interposer surrounding a TSV in accordance with another embodiment disclosed within this specification. More particularly, FIG. 4 illustrates the manner in which forces applied to a multi-die IC silicon interposer, such as interposer 205, can result in the application of stress on portions of interposer 205. FIG. 4 illustrates the manner in which stress is concentrated in the area surrounding a TSV such as TSV 325.

As previously described, physical coupling of interposer 205 to one or more other dies and IC packaging can result in the application of forces to interposer 205. The conductive material within TSV 325 also can result in the application of forces to interposer 205. The forces can create stress within the material used to implement interposer 205. In general, this stress is increased in and around areas of interposer 205 that surround any opening through interposer 205, such as TSV 325.

To better illustrate how forces generate stress within interposer 205, FIG. 4 depicts a one-dimensional case in which a uni-axial force is applied to interposer 205. In actuality, three-dimensional forces can be applied to interposer 205 that can be oriented along, or between, three orthogonal axes defining the positioning of interposer 205. In this regard, the stress field induced by TSV 325 is not limited to extending outward along line 435 as illustrated within FIG. 4, but rather can extend outward in all directions. It should be appreciated that FIG. 4 is not drawn to scale. FIG. 4 is drawn to more clearly illustrate the forces surrounding a TSV such as TSV 325.

Referring to FIG. 4, a uni-axial force is applied along edges 415 and 420 of interposer 205. The application of force to interposer 205 generates tensile stress within the material used to implement interposer 205. The force applied to an area of an edge of interposer 205 is illustrated by each of arrows 405. Tensile stress present within interposer 205 is illustrated by each of arrows 410. The orientation and length of each of arrows 405 demonstrates the direction and magnitude, respectively, of the force applied to edges 415 and 420 of interposer 205. Similarly, the orientation and length of each of arrows 410 demonstrates the direction and magnitude, respectively, of the stress generated within various areas of interposer 205.

When force is applied to interposer 205, any discontinuity in the material forming interposer 205, e.g., TSV 325, affects the stress concentration in areas surrounding the discontinuity. As a result, inclusion of TSV 325 within interposer 205 increases stress in areas of interposer 205 surrounding TSV 325. Referring to FIG. 4, TSV 325 is implemented as a circular opening filled with a conductive material and having a diameter 430.

The stress created by the presence of TSV 325 within interposer 205 is generally concentrated at the edge of the opening for TSV 325 and decreases along line 435 when moving away from TSV 325. In other words, stress is maximized within interposer 205 along an axis symmetrically bisecting TSV 325 perpendicular to the direction of the force applied to interposer 305, i.e., in this case along diameter 430 and line 435. In general, in areas of interposer 205 parallel to, but above or below diameter 430, stress is distributed in a normalized fashion. For example, the magnitude of the stress concentration along line 440 within interposer 205 has returned to a normalized and evenly distributed stress.

In general, the tensile stress concentration at points 445 and 450 along an edge of TSV 325 can be described by the expression $$\sigma 3 = \sigma 1 \left(1 + \frac{2b}{a}\right).$$

Within the expression for σ3, σ1 represents the uniform, or average, tensile stress within interposer 205, for example, along line 440. The variable a is the radius of TSV 325 that is parallel to the direction of the force. The variable b is the radius of TSV 325 that is perpendicular to the direction of the force. For a substantially circular TSV such as TSV 325, the length of a is approximately equal to the length of b. Thus, the expression $$\frac{2b}{a}$$

reduces to a value of 2 and σ3=3σ1. The expression for σ3 demonstrates that the tensile stress concentration at points 445 and 450, i.e., σ3, is approximately three times the average tensile stress and at a maximum. The phrase "stress concentration factor," generally denoted as $K_t$, can be defined as $K_t = \sigma 3/94\ 1 = 3$.

The presence of increased stress within interposer 205 can affect the performance of active resources implemented within interposer 205. For example, stress can cause variations in carrier mobility within active resources within interposer 205. Considering that the stress concentration, referring to the stress induced by TSV 325, is greater within interposer 205 in the areas surrounding TSV 325 along line 435, the performance of active resources located along line 435 can vary as a consequence of the increased stress concentration introduced by TSV 325.

As noted, FIG. 4 illustrates only a uni-axial force applied to interposer 205 along edges 415 and 420. As noted, the actual stress existing within interposer 205, e.g., including stress generated or induced by inclusion of TSV 325, extends outward in all directions. The concentration of the stress that exists declines as the point of stress measurement moves farther from TSV 325 until the stress concentration reaches the average tensile stress level. In general, the stress concentration or level reduces at a rate of 1/D, where "D" represents the distance from the perimeter of the TSV 325. For example, the stress concentration induced by TSV 325 reaches the normalized tensile stress level at approximately points 455 and 460.

Conventional design techniques utilize the concept of a Keep Out Zone (KOZ) to reduce the impact of stress on active devices. A KOZ is typically designated that defines a particular area within a die such as interposer 205 that surrounds a TSV or other stress inducing structure (stress inducer) in which active resources are not to be located in order to avoid stress induced degradation of operating characteristics of the active resources. Thus, the KOZ can be said to be devoid of active resources. For example, referring to FIG. 4, a circular KOZ 465 can be defined that surrounds TSV 325. The KOZ, for instance, can have a diameter defined by the distance between points 455 and 460, be circular in shape, and be concentric with a center of TSV 325. The region within KOZ 465 represents a region of interposer 205 in which stress is higher than the normalized stress that exists outside of KOZ 465. Conventional design techniques typically refrain from locating active resources within KOZ 465.

As can be appreciated from FIG. 4, when the number of TSVs within a die increases, the many KOZs defined can significantly reduce the usable area of a die for implementing active resources. Moreover, the superposition of stress induced by two or more TSVs can increase the difficulty of eliminating stress induced by TSVs completely.

In accordance with one or more embodiments disclosed within this specification, an aggressive KOZ such as KOZ 470 can be defined that passes through points 475 and 480, e.g., having a diameter equal to the distance between points 475 and 480. In one aspect, KOZ 470 can be defined according to a level of acceptable degradation in one or more operating characteristics of an active resource. For example, KOZ 470 can be defined as a boundary inside of which active resources have an unacceptably low or degraded level for one or more selected operating characteristics, e.g., drive current of a transistor or the like. Outside of KOZ 470, active resources can have a level of the selected operating characteristics that is acceptable, e.g., above a threshold but still below or degraded from a level of the one or more operating characteristics of an active resource located outside of KOZ 465. KOZ 470, for example, can be defined as a region where the selected operating characteristic(s) of an active resource implemented immediately outside of the region, e.g., between the perimeter defined by aggressive KOZ 470 and the perimeter defined by KOZ 465 illustrated as region 485, are degraded only by a predetermined amount or percentage deemed as acceptable.

By defining an aggressive KOZ that is smaller than conventional KOZs, more area of interposer 205 is available to implement active resources. The increased stress within region 485 of interposer 205 still can cause degradation in the active resources implemented therein. In this regard, an analysis of active resources that incorporates the effects of stress, e.g., a stress-aware analysis, can be performed and used to determine how closely to implement active resources to IC structures responsible for inducing stress such as TSV 325. Stress-aware analysis can be used to determine delays of active resources. The delays of active resources, for example, can be exacerbated or lengthened as a consequence of exposing the active resource to increased stress. Thus, degradation in active resources can be addressed and, in some cases, overcome, by utilizing the delay information, as informed by the stress analysis, when performing circuit design functions such as place and route.

In illustration, consider the case in which a multi-die IC is being designed, e.g., physically designed, as a programmable IC that includes one or more TSVs. In determining where to implement or form active resources, e.g., active devices, and thus, where more complex active resources such as pre-fabricated circuit blocks are located, stress-aware analysis can be used. The distance between TSVs, for example, and active resources can be determined. In one example, distance from a stress inducing structure such as a TSV can be used as a proxy for quantifying stress and used to adjust operating characteristics accordingly, including timing.

Subsequently, once the multi-die IC structure is fabricated and a circuit design is to be implemented within the multi-die IC structure, tasks such as placement and routing also can be performed in a stress-aware manner. For example, stress-aware timing models can be utilized for purposes of placement and routing so that the decision to assign particular circuit elements of a circuit design to active resources of the multi-die IC can be made, at least in part, according to stress-aware models. As another example, active resources located within regions such as region 485 can be profiled in terms of operating characteristics such as delay or the like.

Figure 5:
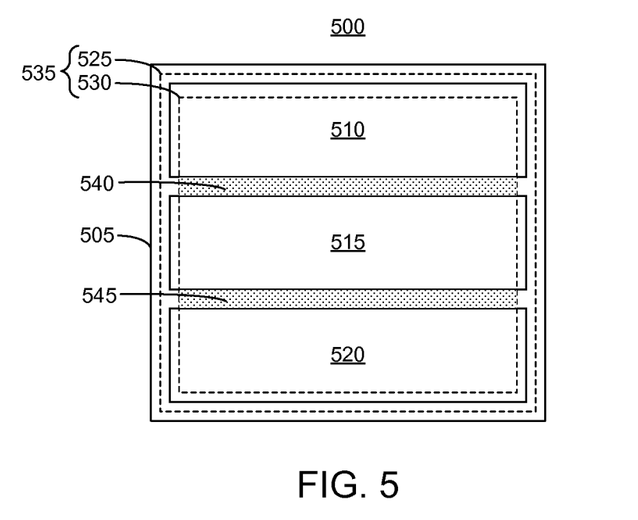
FIG. 5 is a fifth block diagram illustrating a topographic view of a multi-die IC structure in accordance with another embodiment disclosed within this specification.

FIG. 5 is a fifth block diagram illustrating a topographic view of a multi-die IC structure in accordance with another embodiment disclosed within this specification. FIG. 5 illustrates a multi-die IC structure 500 (IC structure 500) including an interposer 505, and dies 510, 515, and 520 implemented on a surface of interposer 505. Dies 510-520 can be coupled to the surface of interposer 505 substantially as described with reference to FIGS. 2 and 3. As noted, interposer 505 is also considered a die of IC structure 500.

FIG. 5 illustrates that interposer 505 undergoes increased stress concentration at the outer edges of each of dies 510-520 coupled thereto. A die attachment perimeter defined by an edge, e.g., an outer edge, of each of dies 510-520 on interposer 505, like TSVs, can be considered a stress inducing structure within interposer 505. Thus, the physical attachment of dies 510-520 to interposer 505 creates increased stress within, for example, the area defined by an outer perimeter 525 and an inner perimeter 530. The area or region between outer perimeter 525 and inner perimeter 530 can be defined as a KOZ 535. As shown, KOZ 535 extends beyond, e.g., outward from, the outer edge of each of dies 510-520. Further, KOZ 535 extends inward toward the center of interposer 505 inside of the edge of each of dies 510-520.

Within FIG. 5, the portion of interposer 505 labeled 540 corresponds to the strip or channel of interposer 505 between the inner edges of each of dies 510 and 515 that is exposed, e.g., not covered by one of dies 510, 515, or 520, and illustrated as a shaded region. In one aspect, channel 540 can be considered part of KOZ 535. In another aspect, channel 540 can be considered to be a KOZ that is separate from, or not included within, KOZ 535. In still another aspect, channel 540 can be considered to be separate from, or not included within KOZ 535, but considered as a region with higher than normalized stress.

Similarly, the portion of interposer 505 labeled 545 corresponds to the strip or channel portion of interposer 505 between the inner edges of each of dies 515 and 520 that is exposed. In one aspect, channel 545 can be considered part of KOZ 535. In another aspect, channel 545 can be considered to be a KOZ that is separate from, or not included within, KOZ 535. In still another aspect, channel 545 can be considered to be separate from, or not included within KOZ 535, but considered as a region with higher than normalized stress. For example, when channels 540 and 545 are excluded from KOZ 535, KOZ 535 generally is restricted to being located along, e.g., parallel to, or proximate to, an outer edge of interposer 505. Accordingly, regions of higher than normalized stress and regions of normalized stress both can exist within inner perimeter 530. Similarly, regions of higher than normalized stress and regions of normalized stress both can exist outside of outer perimeter 525 presuming that interposer 505 is large enough with respect to dies 510-520 to extend far enough beyond outer perimeter 525 to accommodate a region of normalized stress. When channels 540 and 545 are considered to be regions subjected to higher than normalized stress, active resources can be located within such areas and used selectively by circuit designs as described within this specification.

Figure 6:
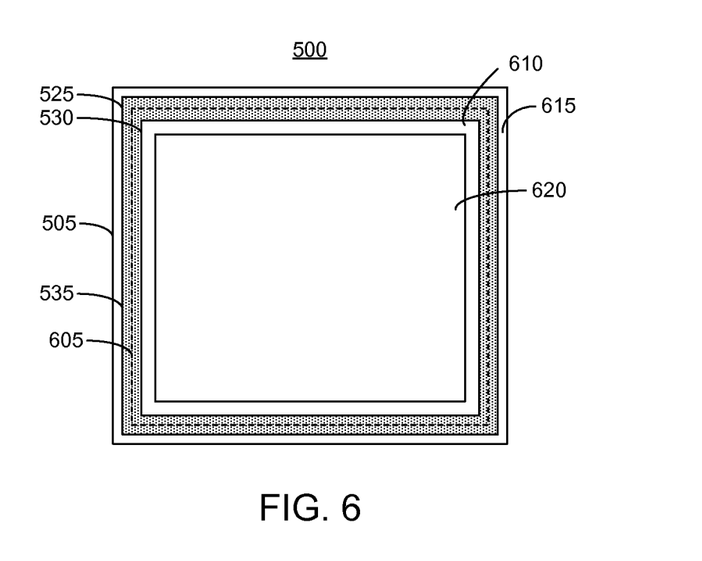
FIG. 6 is a sixth block diagram illustrating a topographic view of the interposer of FIG. 5 in accordance with another embodiment disclosed within this specification.

FIG. 6 is a sixth block diagram illustrating a topographic view of interposer 505 of FIG. 5 in accordance with another embodiment disclosed within this specification. More particularly, FIG. 6 illustrates the location and positioning of KOZ 535 on interposer 505. Dies 510-520 have been omitted to more clearly illustrate KOZ 535 without any obstruction. In an embodiment, the width of KOZ 535 can be dependent upon the number of dies attached to interposer 505. For example, the greater the number of dies attached to interposer 505, the greater the width of KOZ 535, e.g., the greater the distance between inner perimeter 530 and outer perimeter 525 illustrated in FIG. 5.

KOZ 535 can be characterized by beginning a predetermined distance from the outer edge of interposer 505 at outer perimeter 525 and extending inward a predetermined distance to inner perimeter 530. The channel portion defined by, e.g., between, the inner perimeter 530 and outer perimeters 525 can form a rectangular ring within which the outer edge of each die attached to a top of interposer 505 is located. In this regard, dotted line 605 indicates a perimeter that can be defined by the outer edges of each of dies 510-520 upon interposer 505 referred to as a die attachment perimeter. A die attachment perimeter, like TSVs, can be considered a stress inducing structure of interposer 505. For example, the die attachment perimeter illustrated by dotted line 605 can be located in the middle of KOZ 535, e.g., half way between each of inner perimeter 530 and outer perimeter 525. The die attachment perimeter can be concentric with interposer 505, at least with respect to the particular configuration shown. In other examples, the die attachment perimeter need not be located in the middle of KOZ 535, but rather can conform to the edge of each die that is attached to a surface of interposer 505. The super-positioning of such die attachment perimeters can result in non-uniform KOZ shapes or ring structures.

It should be appreciated that the portions of the die attachment perimeters that traverse across interposer 505, e.g., parallel to channels 540 and 545 of FIG. 5, have been excluded for purposes of illustration and clarity. Still, each of dies 510-520 creates a die attachment perimeter that is defined by the edge of each respective one of dies 510-520 upon interposer 505. It also should be appreciated that KOZ 535 can be created or induced by the attachment of a single larger die to interposer 505, where the outer edge of the attached, single die can be defined by dotted line 605.

As was the case with KOZs described with reference to FIG. 4, KOZ 535 can be aggressively sized so that active resources positioned immediately adjacent to an inner or outer boundary of KOZ 535 can be subjected to increased stress, e.g., a higher than normalized stress concentration. For example, active resources located within region 610 or 615 can be exposed to higher than normalized stress concentration. Active resources implemented within region 620, however, can be exposed to normalized stress concentration.

Figure 7:
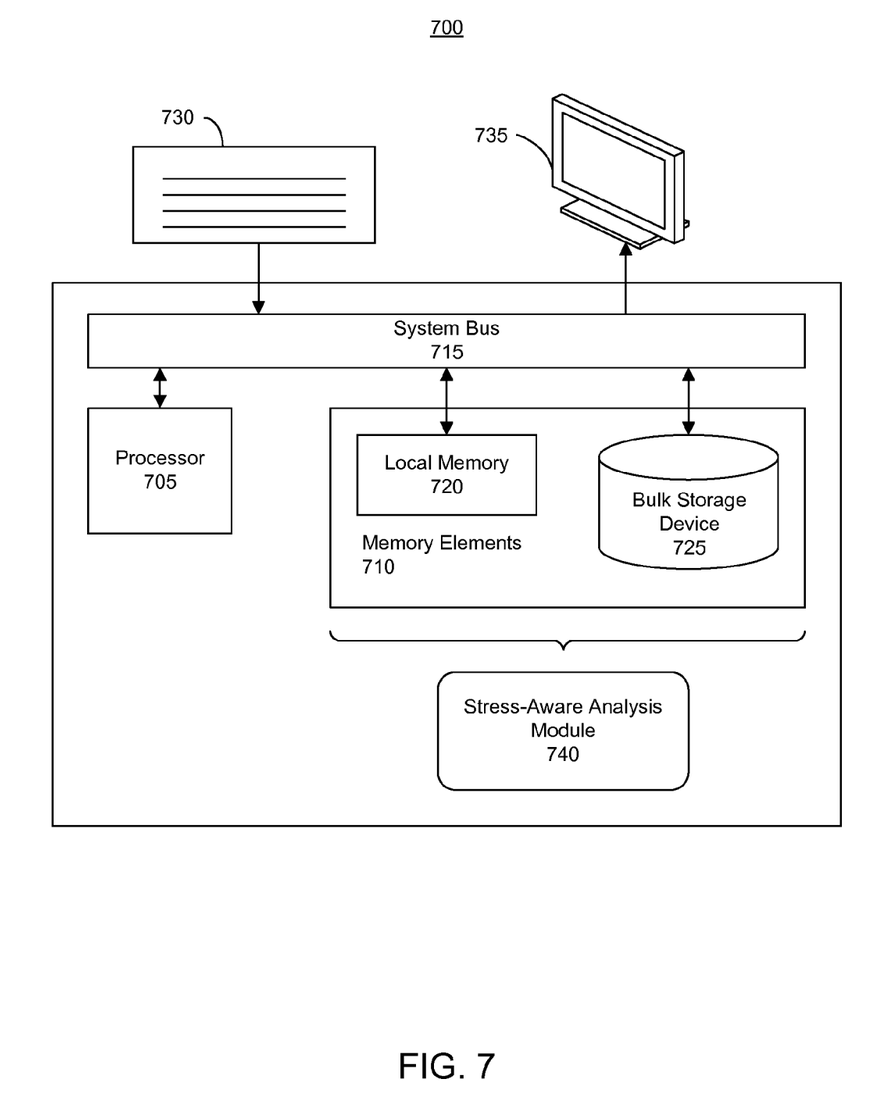
FIG. 7 is a seventh block diagram illustrating a system for performing stress-aware analysis in accordance with an embodiment disclosed within this specification.

FIG. 7 is a seventh block diagram illustrating a system 700 for performing stress-aware analysis in accordance with an embodiment disclosed within this specification. In one aspect, system 700 can evaluate stress data relating to a multi-die IC structure and determine locations at which active resources, e.g., active devices, may or may not be implemented within that multi-die IC structure. In another aspect, system 700 can perform tasks relating to the implementation of a circuit design within a multi-die IC structure, e.g., placement, routing, or the like, in a stress-aware manner.

System 700 can include at least one processor 705 coupled to memory elements 710 through a system bus 715. As such, system 700 can store program code within memory elements 710. Processor 705 can execute the program code accessed from memory elements 710 via system bus 715. In one aspect, for example, system 700 can be implemented as a computer that is suitable for storing and/or executing program code. It should be appreciated, however, that system 700 can be implemented in the form of any system comprising a processor and memory that is capable of performing the functions described within this specification.

Memory elements 710 can include one or more physical memory devices such as, for example, local memory 720 and one or more bulk storage devices 725. Local memory 720 refers to random access memory or other non-persistent memory device(s) generally used during actual execution of the program code. Bulk storage device(s) 725 can be implemented as a hard drive or other persistent data storage device. System 700 also can include one or more cache memories (not shown) that provide temporary storage of at least some program code in order to reduce the number of times program code must be retrieved from bulk storage device 725 during execution.

Input/output (I/O) devices such as a keyboard 730, a display 735, and a pointing device (not shown) optionally can be coupled to system 700. The I/O devices can be coupled to system 700 either directly or through intervening I/O controllers. Network adapters also can be coupled to system 700 to enable system 700 to become coupled to other systems, computer systems, remote printers, and/or remote storage devices through intervening private or public networks. Modems, cable modems, and Ethernet cards are examples of different types of network adapters that can be used with system 700.

As pictured in FIG. 7, memory elements 710 can store a stress analysis module 740. Stress analysis module 740, being implemented in the form of executable program code, can be executed by system 700 and, as such, be considered part of system 700. For example, stress analysis module 740 can be included as part of, or used in cooperation with, an electronic design automation (EDA) tool executing on system 700.

In one aspect, stress analysis module 740 can evaluate data relating to stress applied to a die, such as an interposer, and determine the likely effect upon active resources, e.g., whether active devices or more complex circuitry that includes one or more active devices, when placed at varying locations on the die in relation to the stress applied thereto or the stress inducing structures discussed within this specification that induce stress or greater amounts of stress that exceed normalized stress to which a die is exposed. For example, stress analysis module 740 can store one or more active resource models that incorporate stress as a parameter when estimating one or more operating characteristics of the active resource. This allows stress analysis module 740, for example, to estimate the likely operating characteristic(s), e.g., delay, of an active resource located at various locations on the die, e.g., interposer, and being exposed to varying concentrations of stress.

Data utilized by stress analysis module 740 can be determined using any of a variety of different techniques. In one example, the stress field induced by a structure such as a TSV or a die attachment perimeter of an interposer can be determined by performing a global analysis of forces and resulting stresses for a given IC package. Forces can be estimated or measured with the resulting stress fields being developed mathematically. Stress fields can be mathematically modeled, for example, within each die of the IC package.

The macro model developed for the IC package can be applied and subdivided to provide a micro model that is applicable to active resources, whether at the individual active device level or the circuit block level, across a die. The local effects of stress across the entire interposer, for example, can be evaluated to estimate the stress induced by individual TSVs and/or the die attachment perimeter as applied to one or more different active resources. In one aspect, distance between each active resource and stress inducing structure can be used to evaluate or determine the stress field to which that active resource is subjected as induced by the IC structure(s).

In another aspect, empirical data can be determined for active resources as measured from test structures constructed with various stress inducing structures placed at varying distances from one or more different types of active resources. For example, one or more test structures can be fabricated that locate one or more different types of active resources, whether individual active devices, particular circuit blocks, programmable elements, or the like, at different distances from a structure that induces stress, e.g., a stress inducer. With regard to more complex active resources, the degradation of one or more operating characteristics of the active resource can be determined, for example, as the cumulative effect of the degradation of one or more operation characteristics of one or more or each constituent active resource with the complex active resource. In another example, one or more test structures can be fabricated that locate one or more different types of active resources at different distances from a structure such as the portion of the interposer to which another die is attached. One or more different operating characteristics of the active resources can be measured.

Models can be formulated that predict or estimate the values of one or more operating characteristics of different types of active resources as a function of stress induced by the IC structures. It should be appreciated that the stress induced by a die attachment perimeter can differ from the stress induced by a TSV. Distance between the active resource and the particular structure of interest, e.g., the stress inducer, can be used as a proxy for stress or actual stress measurements. In this manner, the operating characteristics of an active resource can be estimated based upon the distance of that active device from the stress inducing IC structure. Still, the effect of a TSV upon an active resource as a function of distance can differ from the effect of a die attachment perimeter upon an active resource as a function of distance.

Examples of the different types of operating characteristics of an active device that can be incorporated into a model can include, but are not limited to, the saturation current of the active device, slew rate, delay, or the like. For example, delay of an active resource can be presumed to increase with exposure of the active resource to increased stress. The highest degree of degradation for an active resource, for example, can be when the active resource is located immediately outside of an aggressive KOZ. As the active resource is located farther from a stress inducing structure, and thus, farther from a perimeter of the aggressive KOZ, the amount of increase in delay (or amount of degradation in another operating characteristic) of the active resource attributable to exposure to increased stress can begin to decline. In general, the degradation in delay (e.g., the increase in delay) attributable to increased stress declines as stress declines and, therefore, as distance between the active resource and the stress inducing structure increases.

Measured operating characteristics can be correlated with physical properties of the active resource such as, for example, orientation of the active resource compared with the stress inducing structure, width of the active resource, length of the active resource, whether the active resource is an N-type of device or a P-type of device, or the like. The data measured from actual silicon prototype structures can be used to generate a model that can be used for purposes of IC development, circuit design, and simulation and/or optimization.

Regardless of the manner in which stress-related data is determined, the resulting stress-related data can be used to model active resource behavior as affected by stress caused by a stress inducer such as the circuit structures described within this specification. The resulting models can be utilized to determine where to implement active devices in relation to stress inducing circuit structures, e.g., how close active devices can be located with respect to stress inducing structures for purposes of IC development and fabrication, and further can be used for purposes of implementing a circuit design within an IC structure, e.g., placement and/or routing of a circuit design.

Figure 8:
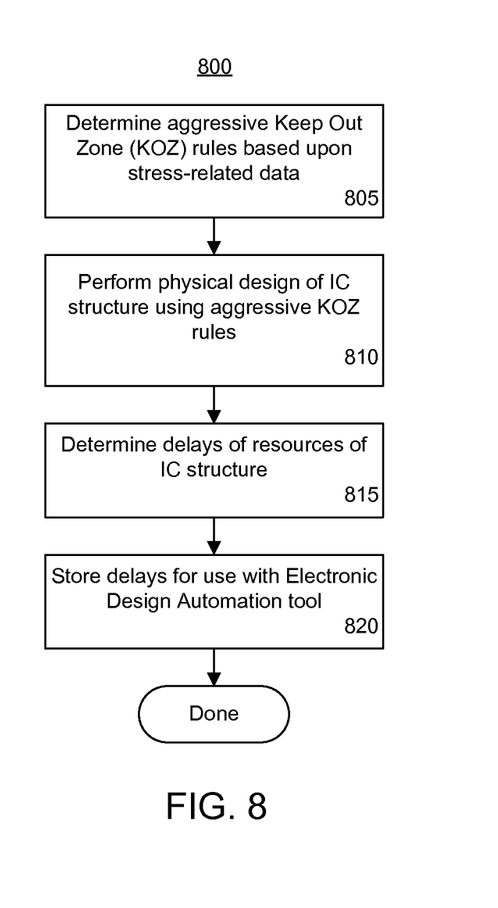
FIG. 8 is a first flow chart illustrating a method of physical design for an IC structure in accordance with another embodiment disclosed within this specification.

FIG. 8 is a first flow chart illustrating a method 800 of physical design for an IC structure in accordance with another embodiment disclosed within this specification. FIG. 8 presents a generalized method that can be used to reduce the size of KOZs to increase the available area of a die for use in implementing or creating active resources. Method 800 can be implemented using a system as described with reference to FIG. 7 in combination, e.g., as a control system, for an IC manufacturing or fabrication system and/or an IC testing and measurement system.

In step 805, the system can determine aggressive KOZ rules based upon stress-related data. The KOZ rules can be created to specify smaller KOZs surrounding stress inducing IC structures. By specifying smaller KOZs, per the KOZ rules, active resources can be implemented closer to stress inducing structures. Degradation in the active resources that may occur due being located in a region of the IC that is exposed to higher stress than would be the case for conventionally sized KOZs, e.g., within a region such as region 485, 610, or 615, can, in some cases, be overcome or compensated for by accounting for the degradations in timing models developed for active resources that can be used subsequently during, for example, placement and routing of a circuit design.

In step 810, physical design of the IC can be performed using the aggressive KOZ rules. The aggressive KOZ rules, for example, can allow the implementation of an active resource within a region of the IC that is exposed to larger stress than otherwise would be the case, e.g., outside of an aggressively sized KOZ and within a conventionally sized KOZ.

In step 815, the system can determine timing models for resources of the IC structure being created including, for example, active resources. The timing models can be developed as discussed through mathematical models, actual measurements of test structures, or a combination of both. The timing models can reflect the delay of resources, including active resources, of the IC as affected by exposure to higher stress concentrations.

As noted, distance between an active resource and a stress inducing structure can be used as a proxy for stress. In this regard, distance can be incorporated into the models so when the active resource is located a distance from the stress inducing structure that is greater than a threshold distance, the model for the active resource is unaffected by stress. For distances less than the threshold distance, e.g., when within a region such as one of regions 485, 610, or 615, distance does affect operating characteristics calculated according to the model such as delay. In another example, a non-stress aware model can be used and a stress-aware model can be used. For those active resources determined to be exposed to a stress concentration or level that is higher than the normalized stress on a die, e.g., within one of regions 485, 610, or 615, a stress-aware model can be used. For those active resources determined not to be exposed to higher than normalized stress, the non-stress aware model can be used. In either case, delays for the resources of the IC structure can be determined using stress-aware information as described.

In either case, delays calculated using the models as described can be calculated or estimated. The delays for different resources of the IC structure, e.g., active resources, can be stored for later use within an EDA tool. For example, stress-aware delays for programmable elements, logic blocks, routing resources such as INTs and/or PIPs can be determined. The particular delay used (e.g., or model as the case may be) for a given active resource will vary according to the location of that active resource and the distance of that active resource to one or more stress inducing structures.

Figure 9:
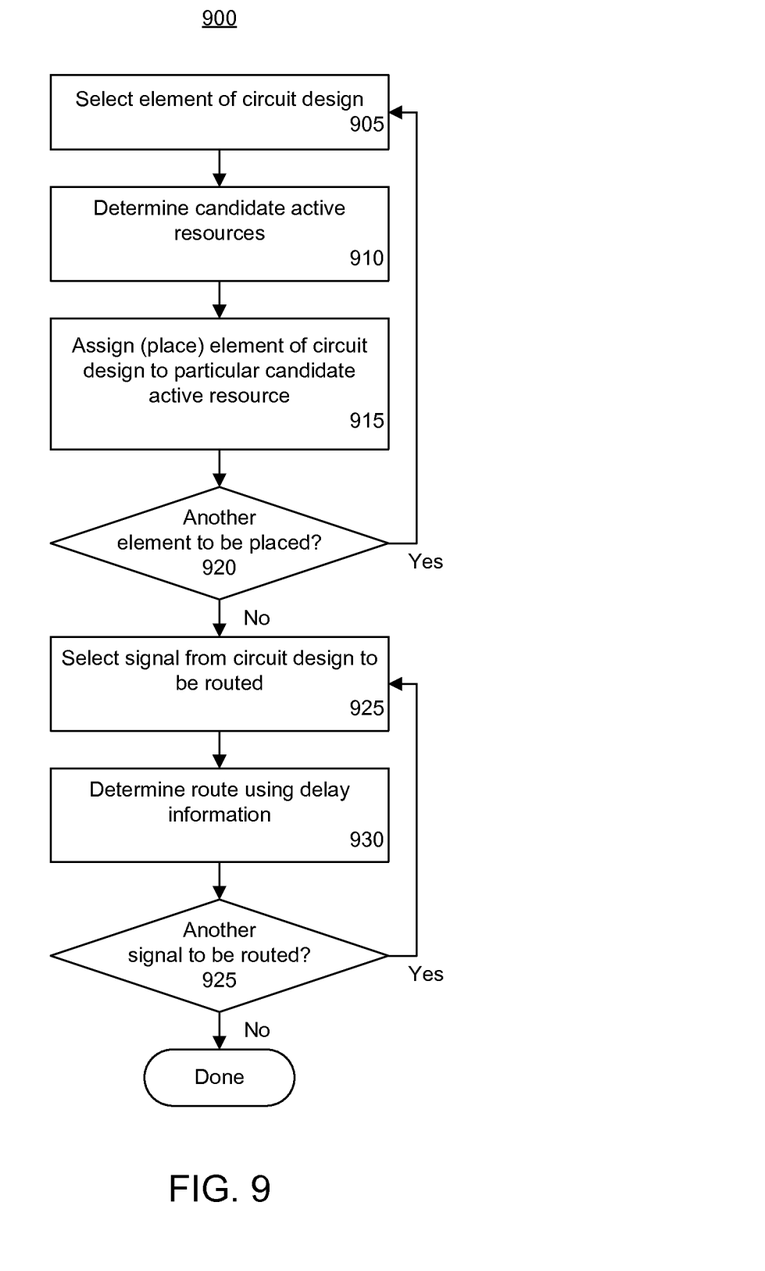
FIG. 9 is a second flow chart illustrating a method of circuit design in accordance with another embodiment disclosed within this specification.

FIG. 9 is a second flow chart illustrating a method 900 of circuit design in accordance with another embodiment disclosed within this specification. Method 900 can be performed by a system such as system 700 described with reference to FIG. 7.

The system can begin a process of placing elements of a circuit design to particular active resources of an IC. Method 900 presumes that functions such as technology mapping and packing have been performed, for example. In step 905, the system can select an element of a circuit design to be placed, e.g., assigned, to a particular active resource of the IC.

In step 910, the system can determine one or more candidate active resources to which the selected circuit element can be assigned. In selecting active resources to which the element of the circuit design can be assigned, the system can utilize delays calculated using the stress-aware models as described. It should be appreciated that for active resources not exposed to higher than normalized stress, conventional delays can be used. In this regard, the system can identify active resources that are not located within regions subjected to higher than a normalized stress concentration, active resources that are located within regions subjected to higher than normalized stress concentrations, or a combination of both.

In an aspect, when considering candidate active resources, only those active resources that are located outside of regions such as regions 485, 610, and/or 615 can be considered. For example, one or more elements of the circuit design can be tagged or otherwise identified as critical. For instance, elements identified as being on or along a signal path with critical timing, e.g., where timing is not being met according to a specification, can be identified as being critical. Two flip-flop circuit elements coupled by a signal, e.g., a net, with no slack available, or an amount of slack that is considered less than a threshold, can be considered critical. In another aspect, the estimated delay between the two elements as compared to a worst case signal path can be compared to determine criticality. In any case, during placement, the system can prevent elements identified as critical from being assigned to active resources exposed to higher than normalized stress concentrations, e.g., those active resources located in regions such as regions 485, 610, and/or 615. In another aspect, as long as timing requirements of the circuit design are met, active resources that are sufficiently close to a stress inducing structure to have a degraded delay still can be used or assigned elements that are or are not identified as critical.

In step 915, the system can assign the selected element of the circuit design to one of the candidate active resource, at least in part, due to the delay. The particular model or operating characteristic(s) used in determining whether the element is assigned to a selected candidate active resource can vary according to the location of each respective candidate active resource, e.g., be stress-aware or not. In step 920, the system can determine whether any further elements of the circuit design must be placed. When at least one additional element of the circuit design must be placed, method 900 can loop back to step 905 to continue processing elements. When no further elements of the circuit design remain to be placed, method 900 can continue to step 925.

In step 925, the system can select a signal of the circuit design to be routed. In step 930, the system can determine a route for the signal using delay information for active resources. For example, the delay of using particular routes can vary according to the stress to which active resources such as INTs and PIPs are exposed. Routes that utilize such active resources exposed to higher than normalized stress, e.g., located in a region such as one of regions 485, 610, or 615, can have higher delays than active resources subjected to normalized stress.

In determining a route for a particular signal, the system can determine the route using available delay information for those active resources utilized and ensure that timing requirements are met. In this regard, the system can identify active resources that are not located within regions subjected to higher than a normalized stress concentration, active resources that are located within regions subjected to higher than normalized stress concentrations, or a combination of both in forming and selecting a route for the signal. In another example, for those signals determined to be critical, e.g., whether tagged or otherwise identified, the system can forego using any active resources having a degraded delay due to exposure to increased stress when routing. In any case, the resulting route for the selected signal can be evaluated to ensure that timing constraints or objectives are met using the appropriate model and/or delay, e.g., stress-aware information.

In step 935, the system can determine whether any additional signals of the circuit design remain to be routed. When at least one additional signal must be routed, method 900 can loop back to step 925. When no further signals remain to be routed, the method can end with the resulting circuit design, including any placement and/or routing information generated by method 900 being stored therein.

The methods illustrated in FIGS. 8 and 9 are presented for purposes of illustration and are not intended to limit the one or more embodiments disclosed within this specification. Each method serves as a generalized example to illustrate aspects disclosed herein regarding the use of stress information to inform decisions regarding implementation of active resources and circuit design using active resources. It should be appreciated that the techniques described within this specification can be applied to other types of IC design and circuit design implementation techniques beyond those illustratively described herein.

The flowcharts in the figures illustrate the architecture, functionality, and operation of possible implementations of systems, methods and computer program products according to one or more embodiments disclosed within this specification. In this regard, each block in the flowcharts can represent a module, segment, or portion of code, which includes one or more portions of executable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustrations, and combinations of blocks in the flowchart illustrations, can be implemented by special purpose hardware-based systems that perform the specified functions or acts, or combinations of special purpose hardware and executable instructions.

One or more embodiments can be realized in hardware or a combination of hardware and software. One or more embodiments can be realized in a centralized fashion in one system or in a distributed fashion where different elements are spread across several interconnected systems. Any kind of data processing system or other apparatus adapted for carrying out at least a portion of the methods described herein is suited.

One or more embodiments further can be embedded in a device such as a computer program product, which comprises all the features enabling the implementation of the methods described herein. The device can include a data storage medium, e.g., a non-transitory computer-usable or computer-readable medium, storing program code that, when loaded and executed in a system comprising memory and a processor, causes the system to perform at least a portion of the functions described within this specification. Examples of data storage media can include, but are not limited to, optical media, magnetic media, magneto-optical media, computer memory such as random access memory, a bulk storage device, e.g., hard disk, or the like.

The terms "computer program," "software," "application," "computer-usable program code," "program code," "executable code," variants and/or combinations thereof, in the present context, mean any expression, in any language, code or notation, of a set of instructions intended to cause a system having an information processing capability to perform a particular function either directly or after either or both of the following: a) conversion to another language, code, or notation; b) reproduction in a different material form. For example, program code can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

One or more embodiments disclosed within this specification can be embodied in other forms without departing from the spirit or essential attributes thereof. Accordingly, reference should be made to the following claims, rather than to the foregoing specification, as indicating the scope of the one or more embodiments.

What is claimed is:
1. An integrated circuit (IC) comprising:
a first die comprising a stress inducing structure,
wherein the first die comprises:
a first zone characterized by a substantially normalized stress throughout the first zone, and a second zone induced by the stress inducing structure and characterized by a higher than normalized stress throughout the second zone; and
a second die mounted on a surface of the first die,
wherein the stress inducing structure comprises a die attachment perimeter defined by an outer edge of the second die on the first die, and
wherein the first die comprises a keep out zone defined by an internal perimeter within the die attachment perimeter and an external perimeter external to the die attachment perimeter.

2. The IC of claim 1, wherein the second zone encompasses the external perimeter.

3. The IC of claim 1, further comprising:
a third die mounted on the surface of the first die,
wherein the second die and the third die are separated by a predetermined distance to expose a channel of the first die between the second die and the third die,
wherein the stress inducing structure comprises a die attachment perimeter defined by an outer edge of each of the second die and the third die on the first die, and
wherein the second zone comprises the channel of the first die between the second die and the third die.

4. The IC of claim 1, further comprising:
a third die mounted on the surface of the first die,
wherein the second die and the third die are separated by a predetermined distance to expose a channel of the first die between the second die and the third die,
wherein the stress inducing structure comprises a die attachment perimeter defined by an outer edge of each of the second die and the third die on the first die, and
wherein the channel of the first die between the second die and the third die is a keep out zone.

5. The IC of claim 1, wherein the stress inducing structure comprises a Through Silicon Via (TSV).

6. The IC of claim 5, wherein the second zone encompasses the TSV and the first zone encompasses the second zone.

7. The IC of claim 1, wherein the second zone is within the internal perimeter.

8. The IC of claim 7, wherein the first zone is located within the internal perimeter and is encompassed by the second zone.

9. A device comprising:
a non-transitory data storage medium usable by a system comprising a processor and a memory, wherein the data storage medium stores program code that, when executed by the system, causes the system to execute operations comprising:
identifying an active resource implemented within the IC within a region of an interposer of the IC exposed to an amount of stress that exceeds a normalized amount of stress on the interposer; and
selectively assigning an element of the circuit design to be implemented within the IC to the active resource according to a stress-aware analysis of the circuit design as implemented within the IC,
wherein the active resource is located in the interposer of the IC that includes a stress inducer causing the amount of stress, wherein the stress inducer comprises a die attachment perimeter defined by an outer edge of a second die of the IC on the interposer,
wherein the interposer comprises a keep out zone defined by an internal perimeter within the die attachment perimeter and an external perimeter external to the die attachment perimeter, and
wherein the region in which the active resource is implemented is within a predetermined distance of the keep out zone.

10. The device of claim 9, wherein the data storage medium further causes the system to perform an operation comprising:
using a stress-aware timing model for the active resource, wherein the stress-aware timing model for the active resource depends upon a distance between the active resource and the stress inducer.

11. A method of circuit design involving an integrated circuit (IC) comprising an interposer, the method comprising:
identifying an active resource implemented within the IC within a region of the interposer exposed to an amount of stress that exceeds a normalized amount of stress on the interposer; and
selectively assigning an element of the circuit design to be implemented within the IC to the active resource according to a stress-aware analysis of the circuit design as implemented within the IC,
wherein the active resource is located in the interposer of the IC that includes a stress inducer causing the amount of stress, wherein the stress inducer comprises a die attachment perimeter defined by an outer edge of a second die of the IC on the interposer,
wherein the interposer comprises a keep out zone defined by an internal perimeter within the die attachment perimeter and an external perimeter external to the die attachment perimeter, and
wherein the region in which the active resource is implemented is within a predetermined distance of the keep out zone.

12. The method of claim 11, wherein selectively assigning the element further comprises:
selectively mapping the element to the active resource.

13. The method of claim 11, wherein selectively assigning the element further comprises:
selectively using the active resource when routing the circuit design.

14. The method of claim 11, further comprising:
only using the active resource to implement the element of the circuit design responsive to determining that timing of the circuit design when using the active resource is non-critical.

15. The method of claim 11, further comprising:
using a stress-aware timing model for the active resource.

16. The method of claim 15, wherein the stress-aware timing model for the active resource depends upon a distance between the active resource and the stress inducer.

17. The method of claim 16, wherein the stress inducer comprises a Through Silicon Via (TSV).

18. The method of claim 16, further comprising:
determining that the active resource is located within a predetermined distance of the stress inducer and, in response, determining an operational characteristic of the active resource as a function of distance from the stress inducer.

* * * * *